US012782406B2

(12) United States Patent
Uetsuhara et al.

(10) Patent No.: US 12,782,406 B2
(45) Date of Patent: Nov. 3, 2026

(54) CONNECTION ADAPTER AND HORN ANTENNA MEASUREMENT DEVICE

(71) Applicant: Institute for Q-shu Pioneers of Space, Inc., Fukuoka (JP)

(72) Inventors: Masahiko Uetsuhara, Fukuoka (JP); Daisuke Yamamoto, Fukuoka (JP); Hitoshi Nohmi, Tokyo (JP)

(73) Assignee: INSTITUTE FOR Q-SHU PIONEERS OF SPACE, INC. (JP)

( * ) Notice: Subject to any disclaimer, the term of this patent is extended or adjusted under 35 U.S.C. 154(b) by 201 days.

(21) Appl. No.: 18/258,015

(22) PCT Filed: Dec. 22, 2020

(86) PCT No.: PCT/JP2020/048045
§ 371 (c)(1),
(2) Date: Jun. 16, 2023

(87) PCT Pub. No.: WO2022/137364
PCT Pub. Date: Jun. 30, 2022

(65) Prior Publication Data
US 2024/0003951 A1 Jan. 4, 2024

(51) Int. Cl.
*G01R 29/08* (2006.01)

(52) U.S. Cl.
CPC .......... *G01R 29/0878* (2013.01)

(58) Field of Classification Search
CPC .......... H01Q 1/288; H01Q 1/24; H01Q 1/255; H01Q 13/0208; H01Q 13/02;
(Continued)

(56) References Cited

U.S. PATENT DOCUMENTS 5,455,085 A 10/1995 Miller
6,834,546 B2 * 12/2004 Edvardsson .......... G01F 23/284 73/290 R (Continued)

FOREIGN PATENT DOCUMENTS

EP 0632525 A1 * 1/1995 .......... H01Q 15/244
JP 2002368561 A 12/2002

(Continued)

OTHER PUBLICATIONS

Extended European Search Report for EP Application No. 20966855. 7-1001, mailing date Sep. 11, 2024, 5 pages, EPO.

(Continued)

*Primary Examiner* — Dameon E Levi
*Assistant Examiner* — Gurbir Singh
(74) *Attorney, Agent, or Firm* — Jaffery Watson Hamilton & DeSanctis LLP

(57) ABSTRACT

To provide a connection adapter and a horn antenna measurement device capable of measuring the performance of a system of a horn antenna on the ground without removing the horn antenna mounted on a spacecraft even immediately before the launch, while suppressing radio wave leakage to an external space. A connection adapter (200) includes a first waveguide (201) that is provided inside the connection adapter and connected to a waveguide portion (260) connected to a horn antenna (100), in which the connection adaptor is detachably fitted into the horn antenna, is connected to a measurement instrument (300) via a second waveguide (250) coupled to the first waveguide, and guides radio waves radiated from the horn antenna to the measurement instrument in a closed system.

14 Claims, 6 Drawing Sheets

(58) Field of Classification Search
CPC ................ G01R 29/0878; G01R 29/00; G01R 29/08–10; G01R 1/24
See application file for complete search history.

(56) References Cited

U.S. PATENT DOCUMENTS

| | | | | |
|---|---|---|---|---|
| 11,223,139 | B2 | 1/2022 | Onishi et al. | |
| 2009/0140906 | A1 | 6/2009 | Rao et al. | |
| 2015/0323581 | A1* | 11/2015 | Reynolds | G01R 29/10 343/703 |
| 2018/0109334 | A1* | 4/2018 | Reynolds | H01Q 13/02 |

FOREIGN PATENT DOCUMENTS

| | | | |
|---|---|---|---|
| JP | 2014059156 | A | 4/2014 |
| WO | 2017221872 | A1 | 12/2017 |

OTHER PUBLICATIONS

Rahmat-Samii Yahya et al: "Development of Highly Constrained 1 m Ka-Band Mesh Deployable Offset Reflector Antenna for Next Generation CubeSat Radars", IEEE Transactions On Antennas and Propagation, IEEE, USA, vol. 67, No. 10, Oct. 1, 2019 (Oct. 1, 2019), pp. 6254-6266, XP011749126.
International Search Report issued by the Japan Patent Office for PCT/JP2020/048045, mailing date Mar. 30, 2021, 2 pages.

* cited by examiner

CONNECTION ADAPTER AND HORN ANTENNA MEASUREMENT DEVICE

CROSS-REFERENCE TO RELATED APPLICATIONS

This application is a national phase application of International Application No. PCT/JP2020/048045, filed on Dec. 22, 2020, which is hereby incorporated by reference in its entirety for all purposes.

TECHNICAL FIELD

The present disclosure relates to a connection adapter and a horn antenna measurement device.

BACKGROUND

Hitherto, a spacecraft such as an artificial satellite on which various radars (antennas) including a synthetic aperture radar are mounted has been known (see Patent Literature 1). Here, it is necessary to grasp (measure or test) on the ground in advance whether high-frequency radio waves (and reflected waves thereof) radiated from an antenna mounted on the spacecraft, particularly a horn antenna, have desired characteristics (frequency) or the like.

Such prior ground measurement or ground test needs to be performed in consideration of radio station license regulations, regulations for preventing radio frequency (RF) interference with surrounding equipment, and the like. Therefore, hitherto, as illustrated in FIG. 1, in order to measure or test the performance of a system of a horn antenna 100, it is usually necessary to separately connect a dedicated measurement system (a measurement unit 500, a measurement instrument 300, or the like) after removing the horn antenna 100. As a result, a transmitter 133 that oscillates radio waves on the horn antenna 100 and the measurement unit 500 are connected, and the ground measurement or ground test is performed after a measure for suppressing radio wave leakage into the air (external space) is separately taken.

CITATION LIST

Patent Literature

Patent Literature 1: WO 2017/221872 A

SUMMARY OF INVENTION

Technical Problem

However, for example, in an artificial satellite, since it is substantially impossible to remove the horn antenna immediately before the launch where various components (instruments, parts, and the like) are fixed, there is a problem that the soundness of the system of the horn antenna immediately before the launch cannot be confirmed.

Therefore, according to various embodiments, there are provided a connection adapter and a horn antenna measurement device capable of measuring the performance of a system of a horn antenna on the ground without removing the horn antenna mounted on a spacecraft even immediately before the launch, while suppressing radio wave leakage to an external space.

Solution to Problem

A connection adapter according to one aspect includes a first waveguide that is provided inside the connection adapter and connected to a waveguide portion connected to a horn antenna, in which the connection adaptor is detachably fitted into the horn antenna, is connected to a measurement instrument via a second waveguide coupled to the first waveguide, and guides radio waves radiated from the horn antenna to the measurement instrument in a closed system.

In the connection adapter according to one aspect, a cross-sectional shape of one end of the first waveguide is the same as a cross-sectional shape of a radio wave opening end of the horn antenna, and a cross-sectional shape of the other end of the first waveguide is the same as a cross-sectional shape of the second waveguide.

In the connection adapter according to one aspect, a choke portion extending toward the inside of the connection adapter is formed on an outer surface of the connection adapter.

A horn antenna measurement device according to one aspect includes a horn antenna, a measurement instrument that measures radio waves radiated from the horn antenna, and a connection adapter that includes a first waveguide provided inside the connection adapter and connected to a waveguide portion connected to the horn antenna, is detachably fitted into the horn antenna, is connected to the measurement instrument via a second waveguide coupled to the first waveguide, and guides the radio waves radiated from the horn antenna to the measurement instrument in a closed system.

In the horn antenna measurement device according to one aspect, a cross-sectional shape of one end of the first waveguide is the same as a cross-sectional shape of a radio wave opening end of the horn antenna, and a cross-sectional shape of the other end of the first waveguide is the same as a cross-sectional shape of the second waveguide.

In the horn antenna measurement device according to one aspect, a choke portion extending toward the inside of the connection adapter is formed on an outer surface of the connection adapter.

Advantageous Effects of Invention

According to various embodiments, it is possible to provide the connection adapter and the horn antenna measurement device capable of measuring the performance of a system of a horn antenna on the ground without removing the horn antenna mounted on a spacecraft even immediately before the launch, while suppressing radio wave leakage to an external space.

DESCRIPTION OF EMBODIMENTS

Figure 1:
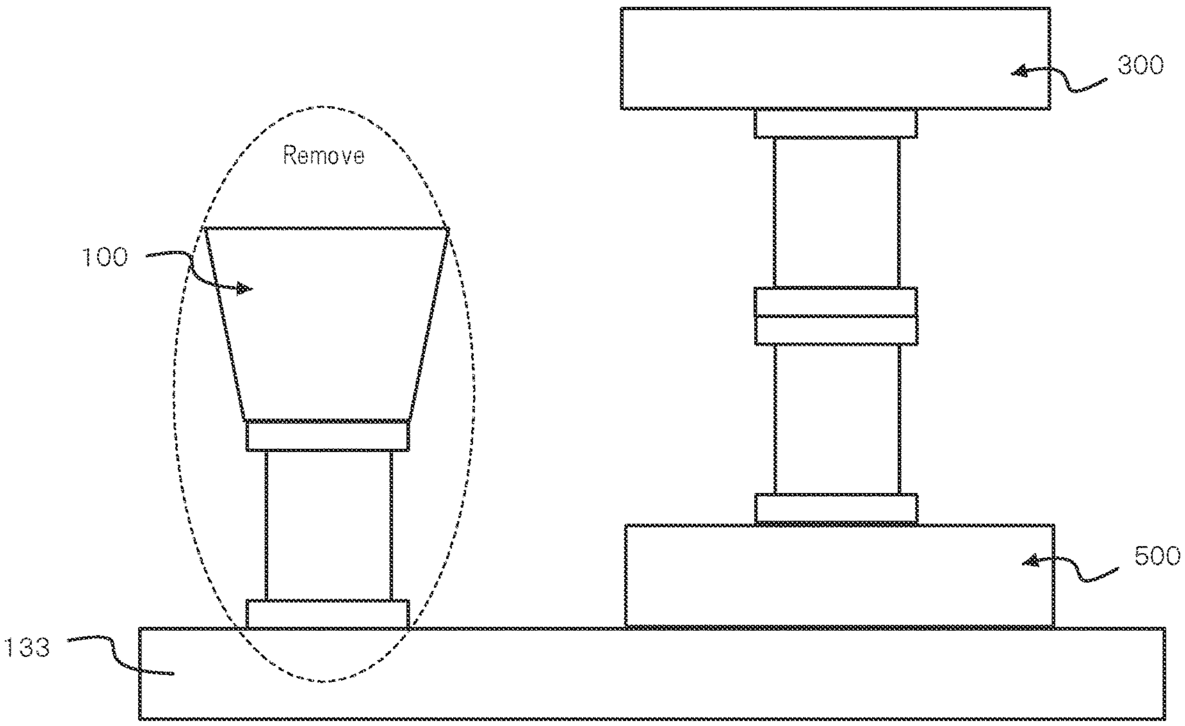
FIG. 1 is a schematic view schematically illustrating an example of a configuration of a horn antenna measurement device using a measurement unit according to the related art.

Hereinafter, various embodiments of the present disclosure will be described with reference to the accompanying drawings. Additionally, components common in the drawings are denoted by the same reference signs. Further, it should be noted that components illustrated in a certain drawing may be omitted in another drawing for convenience of description. Furthermore, it should be noted that the accompanying drawings are not necessarily drawn to scale.

As used in the present disclosure, singular forms such as “a”, “an”, “one”, “the”, “above-described”, “this”, and the like may include plural forms unless such exclusion is explicitly stated. In addition, the term “includes” may mean “comprises”.

Figure 2:
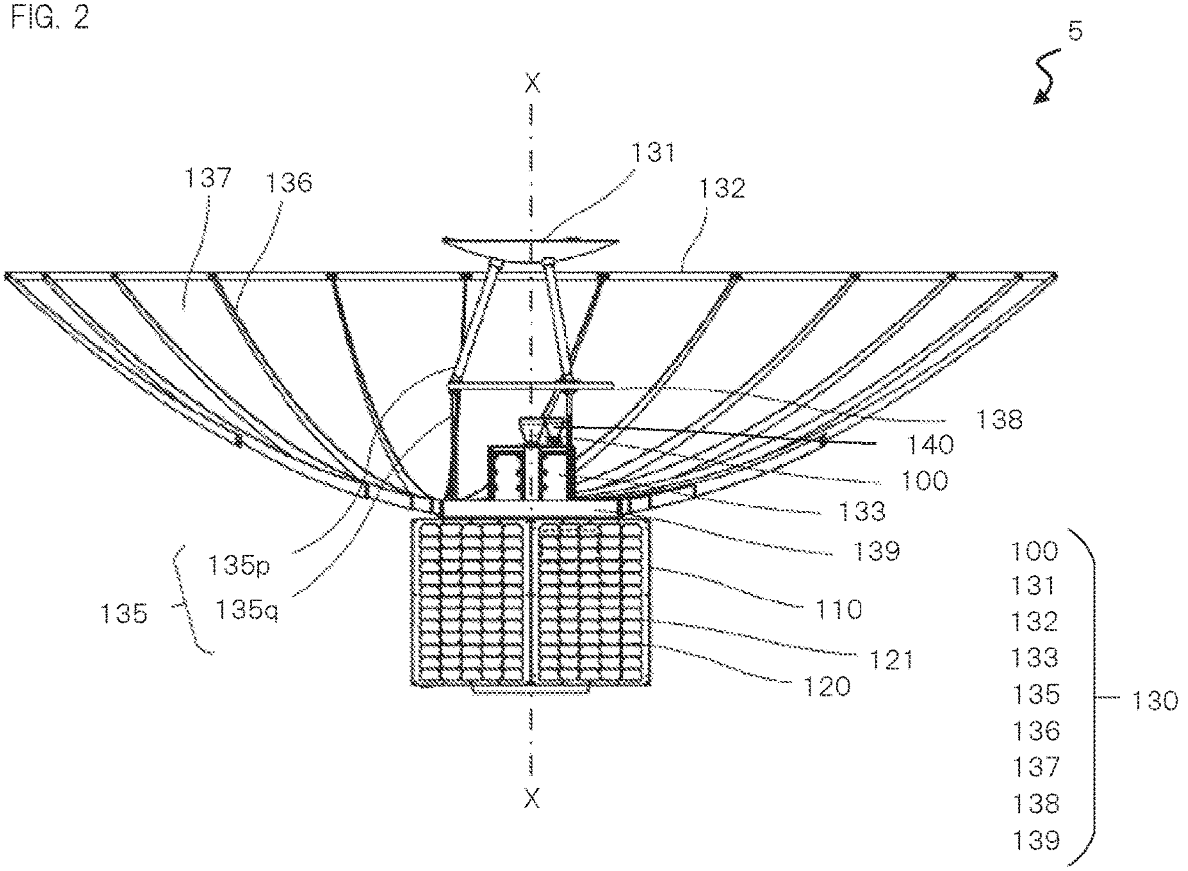
FIG. 2 is a schematic view schematically illustrating an example of a small synthetic aperture radar (SAR) satellite equipped with a horn antenna.
Figure 3:
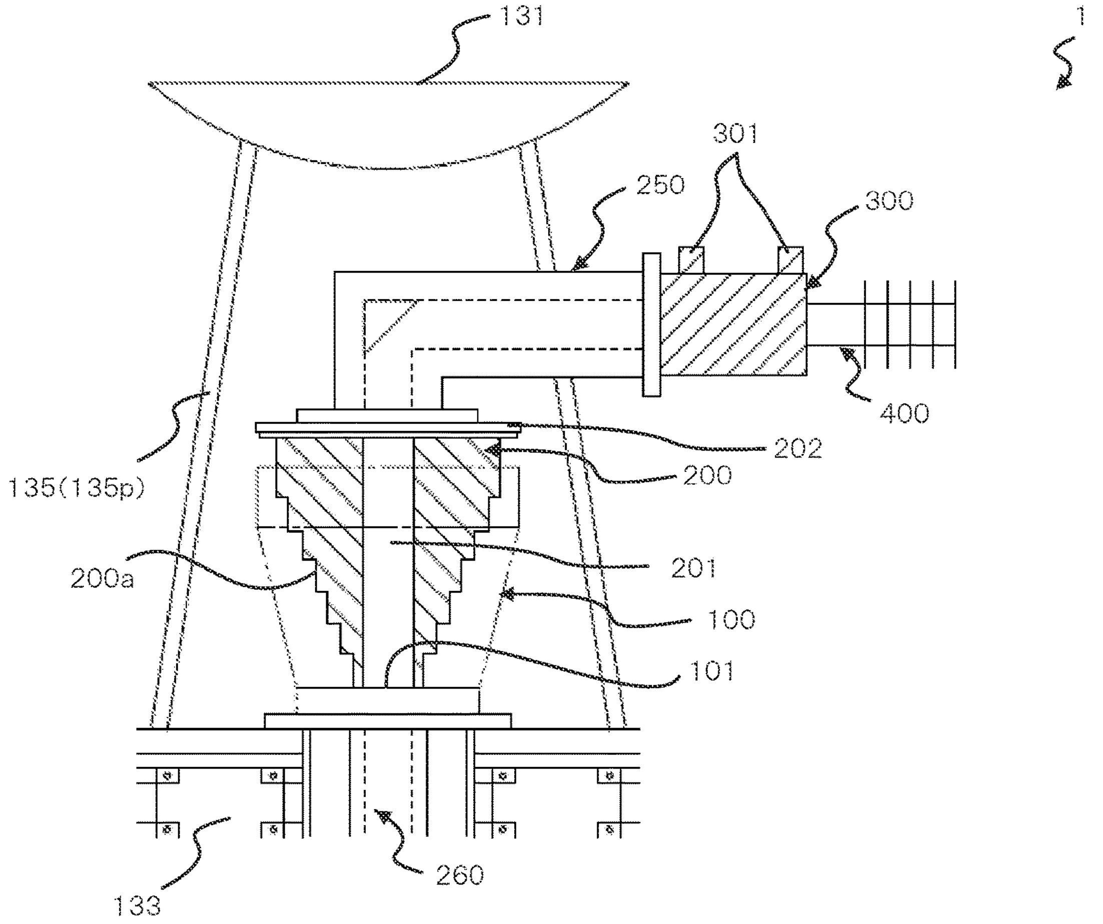
FIG. 3 is a schematic view schematically illustrating an example of a configuration of a horn antenna measurement device according to an embodiment.
Figure 4:
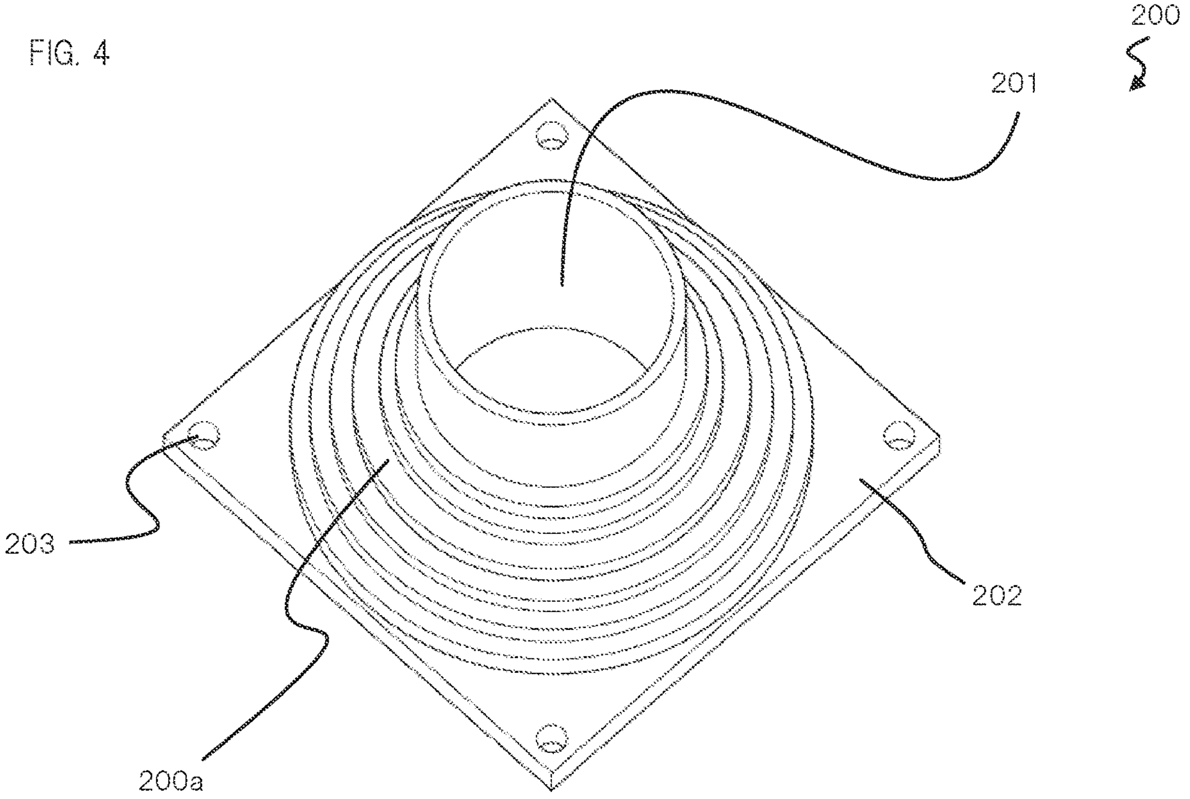
FIG. 4 is a schematic perspective view schematically illustrating an example of a configuration of a connection adapter included in the horn antenna measurement device according to an embodiment.
Figure 5:
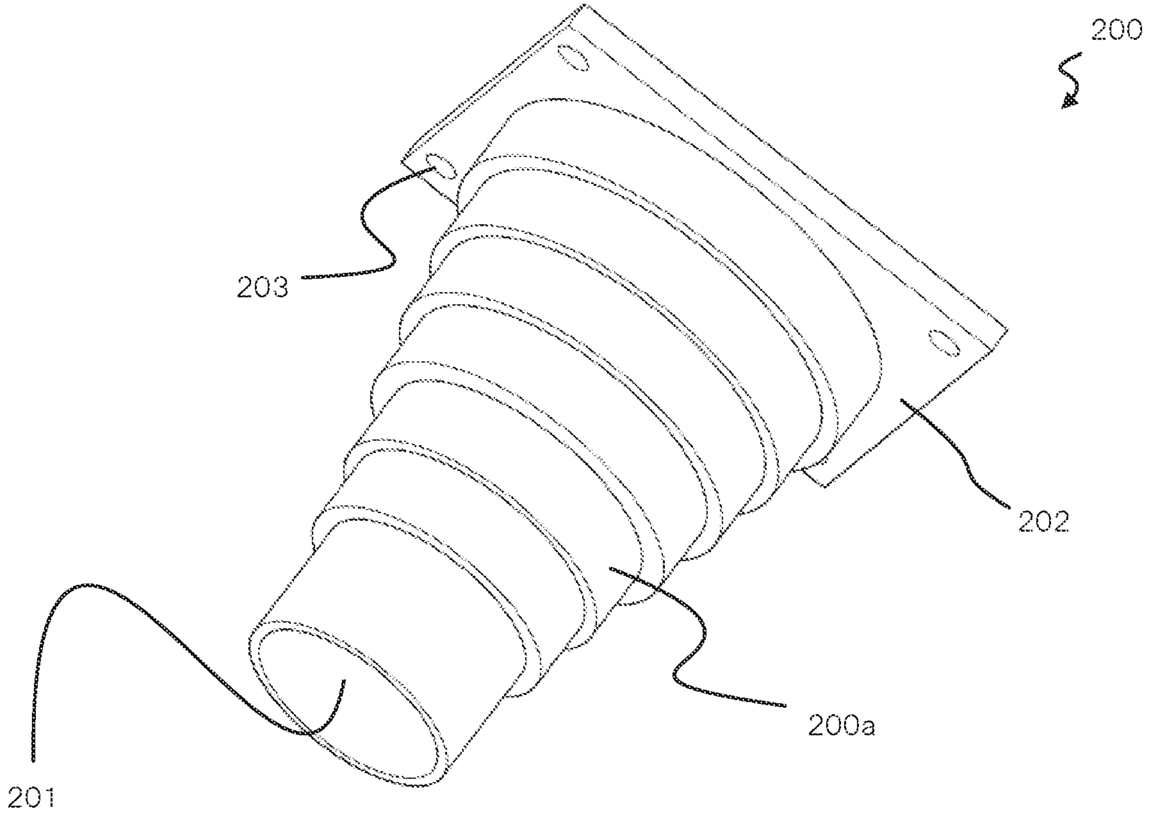
FIG. 5 is a schematic perspective view schematically illustrating the example of the configuration of the connection adapter included in the horn antenna measurement device according to an embodiment.

1. Configuration of Horn Antenna Measurement Device According to Embodiment and Respective Elements Included in Device An overall configuration of a horn antenna measurement device according to an embodiment and an outline of each element included in a horn antenna measurement device 1 will be described with reference to FIGS. 1 to 5. FIG. 1 is a schematic view schematically illustrating an example of a configuration of the horn antenna measurement device 1 using a measurement unit 20 according to the related art. FIG. 2 is a schematic view schematically illustrating an example of a small synthetic aperture radar (SAR) satellite 5 equipped with a horn antenna 100. FIG. 3 is a schematic view schematically illustrating an example of a configuration of a horn antenna measurement device 1 according to an embodiment. FIGS. 4 and 5 are schematic perspective views schematically illustrating an example of a configuration of a connection adapter 200 included in the horn antenna measurement device 1 according to an embodiment.

As illustrated in FIG. 3, the horn antenna measurement device 1 mainly includes the horn antenna 100, a measurement instrument 300 that measures characteristics of radio waves radiated from the horn antenna, and the connection adapter 200 arranged between the horn antenna 100 and the measurement instrument 300. Hereinafter, details of each element included in the horn antenna measurement device 1 will be described.

1-1. Horn Antenna 100 and Spacecraft on which Horn Antenna 100 is Mounted As an example, the horn antenna 100 is mounted on a small synthetic aperture radar (SAR) satellite 5 as a spacecraft. Such a small SAR satellite 5 radiates radio waves in a microwave band, a millimeter wave band, or a sub-millimeter wave band to an observation target, and receives reflected waves from the observation target, so that observation, analysis, and the like of the observation target can be performed.

As illustrated in FIG. 2, the small SAR satellite 5 can mainly include a main body 110 on which instruments such as a control unit that performs control of navigation of the small SAR satellite 5 in space, control of an operation and posture of the small SAR satellite 5, and the like are mounted, a power supply unit 120 that supplies power for driving various components including the control unit and a communication unit in space, and a communication unit 130 that radiates radio waves toward space and receives radio waves from space.

The main body 110 can accommodate various electronic components (not illustrated) such as a computer, a sensor, an actuator, a power supply control circuit, a battery, and a communication control circuit.

The power supply unit 120 can include, for example, a battery, a charge/discharge control circuit, and the like (not illustrated). Examples of the battery can include a solar cell using a solar panel 121. The power supply unit 120 is connected to the main body 110 and the communication unit 130 and can supply power to each of the main body 110 and the communication unit 130.

The communication unit 130 mainly includes the horn antenna 100 as a radiator, a sub reflector (sub reflecting mirror) 131 that is arranged to face the horn antenna 100 at a predetermined angle and reflects radio waves radiated from the horn antenna 100 to a main reflector 132, the main reflector 132 as a main reflecting mirror that further reflects the radio waves reflected by the sub reflector 131 and radiates the radio waves to the outside, a transmitter 133, and support rods 135 for supporting the sub reflector 131.

As the horn antenna 100, a generally known horn antenna having a substantially trumpet shape (horn shape) whose opening area gradually increases toward the sub reflector 131 can be used. An inner portion of the horn antenna 100 has a shape in which a plurality of steps are formed as an example as illustrated in FIG. 3, but is not limited thereto. For example, the sub reflector 131 is illustrated as having a shape of a Cassegrain antenna in FIG. 3, but may be changed to a Gregorian antenna or the like.

The main reflector 132 includes a hub 139, a plurality of ribs 136, a planar body 137, and the like. The main reflector 132 has a reflection surface formed in a parabolic shape in order to function as the main reflecting mirror.

The hub 139 is provided on an antenna axis X at the center of the main reflector 132 and is provided on a side of the main body 110 where the sub reflector 131 is arranged. As an example, the hub 139 is formed in a substantially columnar shape by using a dielectric such as plastic or a metal material such as titanium or stainless steel. The plurality of ribs 136 are radially arranged at predetermined intervals on an outer peripheral surface of the hub 139 around the central axis X.

The ribs 136 include a plurality of ribs. The ribs 136 are arranged in a parabolic shape (radial shape) on the outer periphery of the hub 139 at predetermined intervals around the hub 139. The planar body 137 is bridged over the respective ribs 136 to form a reflecting mirror surface.

The sub reflector 131 is arranged to face the main reflector 132, and a lower surface side of the sub reflector 131 is supported by the support rod 135. The sub reflector 131 is arranged to be separated by a predetermined distance from the horn antenna 100 as the radiator arranged on the central axis X, by the support rod 135. Similarly to the planar body 137 of the main reflector 132, the sub reflector 131 is formed of a material capable of reflecting radio waves and has a quadratic curved surface shape as a whole toward a surface of the main reflector 132. The sub reflector 131 reflects radio waves radiated from the horn antenna 100 toward the main reflector 132.

The support rods 135 include a first support rod 135*p* having one end connected to the sub reflector 131 and the other end connected to a joint 138, and a second support rod 135*q* having one end connected to the joint 138 and the other end connected to the main body 110.

The transmitter 133 includes an oscillator, an amplifier, and the like (not illustrated), and amplifies radio waves having a frequency of a predetermined frequency band generated by the oscillator with the amplifier. The amplified radio waves are once reflected by the sub reflector 131 toward the main reflector 132 via the horn antenna as the radiator, and then radiated to the outside (for example, space) by the main reflector 132. Additionally, reflected waves received from the outside are received by a receiver included in the communication unit 130 through a reverse path.

The communication unit 130 can perform adjustment to radiate radio waves having an appropriate frequency, such as a frequency band of 8 GHz or less, a microwave band of 8 GHz to 12 GHz (so-called X band), a microwave band of 12 GHz to 18 GHz (so-called Ku band), a millimeter wave band of 30 GHz or more, or a sub-millimeter wave band of 300 GHz or more.

The communication unit 130 may also include an additional radiator 140 used for data transmission from the small SAR satellite 5 to a ground station (not illustrated). Similarly to the horn antenna 100, the radiator 140 can use a horn antenna, and is used for communication in a frequency band of 12 GHz to 18 GHz as an example.

The configuration of the small SAR satellite 5 described above is merely an example, and other components may be added as appropriate. In addition, the shape, the number, and the like of components described above can be appropriately changed.

1-2. Connection Adapter 200

As illustrated in FIG. 3, the connection adapter 200 includes a first waveguide 201 provided therein and may thus guide radio waves radiated from the horn antenna 100 to the measurement instrument 300 to be described later via a second waveguide 250 coupled to the first waveguide 201 in a closed system (the radio waves radiated from the horn antenna 100 are not leaked to an external space). A cross-sectional shape of one end of the first waveguide 201 is the same as a cross-sectional shape of a radio wave opening end 101 of the horn antenna 100 (the radio wave opening end 101 of a waveguide portion 260 connected to the horn antenna 100). A cross-sectional shape of the other end of the first waveguide 201 is the same as a cross-sectional shape of the second waveguide 250.

Additionally, in a case where the cross-sectional shape of the radio wave opening end 101 where radio waves from the transmitter 133 that oscillates the radio waves are oscillated is different from the cross-sectional shape of the second waveguide 250 (for example, the cross-sectional shape of the radio wave opening end 101 is circular and the cross-sectional shape of the second waveguide 250 is rectangular), a waveguide converter (not illustrated) may be separately provided in the first waveguide 201 of the connection adapter 200 (alternatively, in the vicinity of the first waveguide 201, for example, upstream of the second waveguide 250).

As illustrated in FIGS. 3 to 5, the connection adapter 200 has, as an example, an outer surface 200*a* having a shape corresponding to a shape of an inner wall of the horn antenna 100. That is, as illustrated in FIG. 3, in a case where the inner wall of the horn antenna 100 has a stepped shape having a plurality of steps as an example, the connection adapter 200 has the outer surface 200*a* having a stepped shape corresponding to the stepped shape. Thus, the connection adapter 200 can be detachably fitted into the inner wall of the horn antenna 100 without forming a substantial gap along the shape of the inner wall of the horn antenna 100. Additionally, as long as the connection adapter 200 is fixed to (fitted into) the horn antenna 100, the entire shape of the outer surface 200*a* of the connection adapter 200 does not necessarily correspond to the shape of the inner wall of the horn antenna 100. In other words, only a part of the outer surface 200*a* of the connection adapter 200 may correspond to the shape of the inner wall of the horn antenna 100.

In addition, the connection adapter 200 can have a plate portion 202 for connection with the second waveguide 250. The plate portion 202 is provided with a connection portion 203 for fixing the second waveguide 250 and the connection adapter 200, and the second waveguide 250 and the connection adapter 200 can be screwed via the connection portion 203.

The connection adapter 200 can be manufactured using, for example, a metal material such as aluminum.

1-3. Measurement Instrument 300

The measurement device 300 can measure the characteristics of radio waves radiated from the horn antenna 100, specifically, the power, the waveform, the phase, and the like. As a configuration and method of the measurement device 300, a known configuration and method (for example, a loopback test) can be used. Various pieces of information measured by the measurement device 300 are transmitted to a recording device, a calculation device (not illustrated), or the like via a coaxial cable (not illustrated) connected to a terminal 301 of the measurement device 300.

Additionally, a terminator 400 that attenuates radio waves radiated from the horn antenna 100 can be connected downstream of the measurement device 300.

The measurement instrument 300 and the above-described connection adapter 200 are connected by the second waveguide 250 having a predetermined length. The shape of the second waveguide 250 may be a straight line shape, or may be, for example, a bent shape bent in a substantially L shape as illustrated in FIG. 3.

As described above, the horn antenna measurement device 1 according to an embodiment including the respective elements can suppress radio wave leakage to an external space in a range from the horn antenna 100 to the measurement instrument 300 and efficiently measure the characteristics of radio waves by the measurement device 300 without removing the horn antenna 100 by using the connection adapter 200.

2. Modification

Figure 6A:
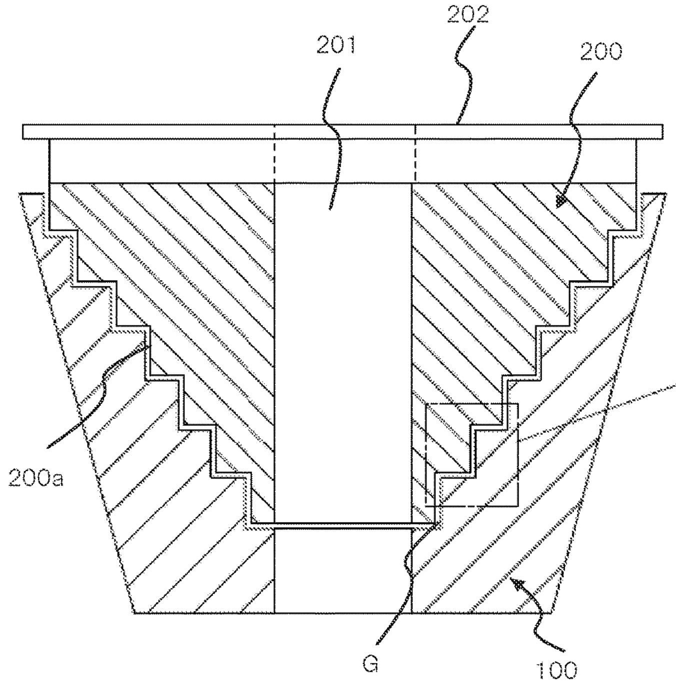
FIG. 6A is a schematic cross-sectional view schematically illustrating a configuration of a modification of the connection adapter.
Figure 6B:
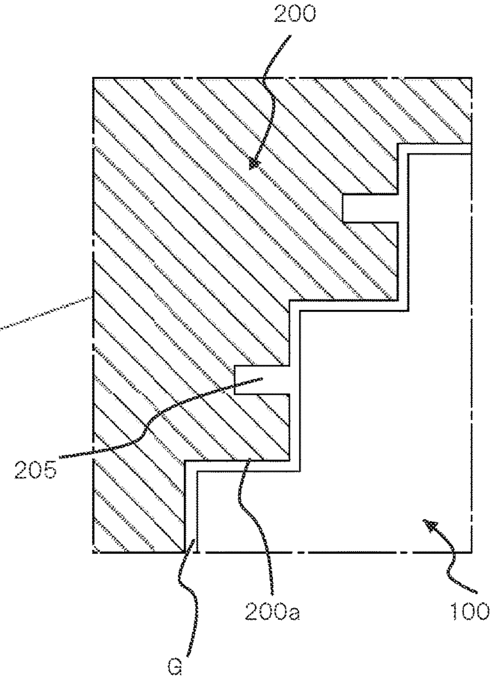
FIG. 6B is an enlarged schematic cross-sectional view illustrating a region surrounded by a line with alternating long and short dashes in FIG. 6A.

Next, a modification of the connection adapter 200 will be described with reference to FIGS. 6A and 6B. FIG. 6A is a schematic cross-sectional view schematically illustrating a configuration of the modification of the connection adapter 200. FIG. 6B is an enlarged schematic cross-sectional view illustrating a region surrounded by a line with alternating long and short dashes in FIG. 6A.

In order to more efficiently suppress leakage of radio waves radiated from the horn antenna 100 to an external space, a choke portion 205 is formed in the connection adapter 200 according to the modification as illustrated in FIG. 6B. As illustrated in FIGS. 6A and 6B, the choke portion 205 is formed on the outer surface 200*a* of the connection adapter 200 that faces the horn antenna 100 and has a cutout shape extending toward the inside of the connection adapter 200.

As a result, even in a case where a slight gap G is formed between the connection adapter 200 and the inner wall of the horn antenna 100, it is possible to attenuate traveling waves by forming reflected waves at the choke portion 205 when the radio waves travel through the gap. Therefore, it is possible to more efficiently suppress radio wave leakage to an external space.

As described above, various embodiments have been exemplified, but the embodiments are merely examples, and are not intended to limit the scope of the invention. The embodiments can be implemented in various other forms, and various omissions, substitutions, and changes can be made without departing from the gist of the invention. In addition, the horn antenna 100 described above is not limited to a case of being used for observation, analysis, and the like of an observation target, and may be used, for example, for downlink for imaging data and the like from the small SAR satellite 5.

All literatures, patent applications, and technical standards described in the present specification are incorporated herein by reference in their entirety.

REFERENCE SIGNS LIST

1 horn antenna measurement device
5 spacecraft (small SAR satellite)
100 horn antenna
200 connection adapter
201 first waveguide
205 choke portion
250 second waveguide
260 waveguide portion
300 measurement instrument

The invention claimed is:

1. A connection adapter comprising
a first waveguide that is provided inside the connection adapter and connected to a waveguide portion connected to a horn antenna; and
a second waveguide coupled to the first waveguide,
wherein the connection adaptor is shaped in a tapered form and has an outer surface having a stepped shape corresponding to a stepped shape of an inner wall of the horn antenna, such that the connection adapter is detachably fitted into the horn antenna without forming a substantial gap and thereby suppressing radio wave leakage of the horn antenna to an external space,
wherein the connection adapter is connected to a measurement instrument via the second waveguide, and the connection adapter is configured to guide radio waves radiated from the horn antenna to the measurement instrument in a closed system.

2. The connection adapter according to claim 1, wherein a cross-sectional shape of one end of the first waveguide is the same as a cross-sectional shape of a radio wave opening end of the horn antenna, and a cross-sectional shape of the other end of the first waveguide is the same as a cross-sectional shape of the second waveguide.

3. The connection adapter according to claim 1, further comprising:
a choke portion extending toward an inside of the connection adapter is formed on an outer surface of the connection adapter.

4. A horn antenna measurement device comprising:
a horn antenna;
a measurement instrument that measures radio waves radiated from the horn antenna; and
a connection adapter that includes a first waveguide provided inside the connection adapter and connected to a waveguide portion connected to the horn antenna,
wherein the connection adapter is shaped in a tapered form and has an outer surface having a stepped shape corresponding to a stepped shape of an inner wall of the horn antenna, such that the connection adapter is detachably fitted into the horn antenna without forming a substantial gap and thereby suppressing radio wave leakage of the horn antenna to an external space,
wherein the connection adapter is connected to the measurement instrument via a second waveguide coupled to the first waveguide, and the connection adapter is configured to guide the radio waves radiated from the horn antenna to the measurement instrument in a closed system.

5. The horn antenna measurement device according to claim 4, wherein a cross-sectional shape of one end of the first waveguide is the same as a cross-sectional shape of a radio wave opening end of the horn antenna, and a cross-sectional shape of the other end of the first waveguide is the same as a cross-sectional shape of the second waveguide.

6. The horn antenna measurement device according to claim 4, further comprising: a choke portion extending toward an inside of the connection adapter is formed on an outer surface of the connection adapter.

7. The connection adapter according to claim 1, wherein the connection adapter is configured to be detachable from the horn antenna by bending the second waveguide.

8. The connection adapter according to claim 7, wherein the second waveguide is bendable into an L shape configuration.

9. The connection adapter according to claim 1, wherein the connection adapter is configured for a loopback test of the horn antenna by the measurement instrument.

10. The connection adapter according to claim 1, wherein the connection adapter is configured for testing an attached satellite in an assembled and in a pre-launch state.

11. The horn antenna measurement device according to claim 4, wherein the connection adapter is configured to be detachable from the horn antenna by bending the second waveguide.

12. The horn antenna measurement device according to claim 11, wherein the second waveguide is bendable into an L shape configuration.

13. The horn antenna measurement device according to claim 4, wherein the connection adapter is configured for a loopback test of the horn antenna by the measurement instrument.

14. The horn antenna measurement device according to claim 4, wherein the connection adapter is configured for testing an attached satellite in an assembled and in a pre-launch state.

* * * * *